(12) United States Patent
Zhao

(10) Patent No.: US 9,735,011 B2
(45) Date of Patent: Aug. 15, 2017

(54) METAL INTERCONNECT STRUCTURE AND FABRICATION METHOD THEREOF

(71) Applicant: Semiconductor Manufacturing International (Shanghai) Corporation, Shanghai (CN)

(72) Inventor: Baojun Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 1 day.

(21) Appl. No.: 14/722,155

(22) Filed: May 27, 2015

(65) Prior Publication Data

US 2015/0364415 A1    Dec. 17, 2015

(30) Foreign Application Priority Data

Jun. 13, 2014    (CN) .......................... 2014 1 0265013

(51) Int. Cl.

| | |
|---|---|
| *H01L 23/48* | (2006.01) |
| *H01L 21/027* | (2006.01) |
| *H01L 21/768* | (2006.01) |
| *H01L 21/311* | (2006.01) |
| *G03F 1/36* | (2012.01) |
| *H01L 23/522* | (2006.01) |

(52) U.S. Cl.
CPC .......... *H01L 21/0274* (2013.01); *G03F 1/36* (2013.01); *H01L 21/31144* (2013.01); *H01L 21/76816* (2013.01); *H01L 23/5226* (2013.01); *H01L 2924/0002* (2013.01)

(58) Field of Classification Search
CPC ........... H01L 21/0274; H01L 21/02164; H01L 21/3212; H01L 21/76816
See application file for complete search history.

(56) References Cited

U.S. PATENT DOCUMENTS

| | | | |
|---|---|---|---|
| 2002/0042006 A1* | 4/2002 | Kawata | ..................... G03F 1/14 430/5 |
| 2007/0069387 A1* | 3/2007 | Kyeun | .............. H01L 21/76816 257/760 |
| 2007/0111109 A1* | 5/2007 | Yen | ......................... G03F 1/144 430/5 |
| 2009/0246648 A1* | 10/2009 | Yen | ........................... G03F 1/36 430/5 |
| 2011/0104867 A1* | 5/2011 | Feustel | ............. H01L 21/76808 438/424 |
| 2014/0264773 A1* | 9/2014 | Chang | ................. G06F 17/5068 257/621 |

* cited by examiner

*Primary Examiner* — Mark Tornow
(74) *Attorney, Agent, or Firm* — Anova Law Group, PLLC

(57) ABSTRACT

A method is provided for fabricating a metal interconnect structure. The method includes forming a reticle having a metal line pattern region and at least a scattering bar by an optical proximity correction process; and providing a semiconductor substrate having a first dielectric layer and at least one conductive via. The method also includes aligning the reticle with the semiconductor substrate with the conductive via to align the scattering bar next to the conductive via; and forming metal line patterns on the first dielectric layer and a top surface of the conductive via to completely cover the conducive via.

17 Claims, 4 Drawing Sheets

METAL INTERCONNECT STRUCTURE AND FABRICATION METHOD THEREOF

CROSS-REFERENCES TO RELATED APPLICATIONS

This application claims the priority of Chinese patent application No. 201410265013.1, filed on Jun. 13, 2014, the entirety of which is incorporated herein by reference.

FIELD OF THE INVENTION

The present invention generally relates to the field of semiconductor manufacturing technology and, more particularly, to metal interconnect structures and fabrication processes thereof.

BACKGROUND

Metal interconnect structures are common structures in the semiconductor devices. A typical metal interconnect structure includes metal line patterns and conductive vias under the metal line patterns. The metal line patterns are usually formed by forming trenches via etching processes; and followed by filling the trenches with a metal material. Recently, with the increasing of the device density, the line width of the metal interconnect structures has become smaller and smaller. During a photolithography process, because of the existence of certain phenomena, such as diffraction, etc., the resolution of an exposure apparatus has an optical limitation. Such a limitation may cause an Optical Proximity Effect (OPE) during a pattern transformation process of the reticle which has patterns corresponding to the metal line patterns. Such an OPE causes an error between the patterns on the reticle and the patterns transferred to a photoresist. Further, this error causes the metal line patterns not to cover the contact vias completely. Thus, the electrical contact between the metal line patterns and the contact vias may be unreliable. Further, the patterned photoresist are significantly long and thin, and a peeling effect may occur due to the error. Thus, adjacent metal line patterns may be connected; and the performance of the metal interconnect structures may not be reliable.

The above-mentioned error is often overcome by an optical proximity correction (OPC) method. One typical OPC method is to change the boundary of the circuit patterns to cause the circuit patterns to have certain pre-deformations. The pre-deformation may cause the circuit patterns to be more similar to the target patterns obtained after developing and exposing processes. Another typical OPC method is to dispose Scattering Bars (SBs) between adjacent metal line patterns. The SBs may be used to prevent the incomplete cover issue of the conductive vias; and prevent the photoresist from peeling.

However, with the further decreasing of the CD of the integrated circuits (ICs), the device density of ICs has been further increased. Thus, the effect of changing boundary for OPC is limited. Further, the distance between adjacent metal line patterns has become smaller and smaller. Thus, it may be inappropriate to form SBs between adjacent metal line patterns. The disclosed device structures and methods are directed to solve one or more problems set forth above and other problems.

BRIEF SUMMARY OF THE DISCLOSURE

One aspect of the present disclosure includes a method for fabricating a metal interconnect structure. The method includes forming a reticle having a metal line pattern region and at least a scattering bar by an optical proximity correction process; and providing a semiconductor substrate having a first dielectric layer and at least one conductive via. The method also includes aligning the reticle with the semiconductor substrate with the conductive via to align the scattering bar next to the conductive via; and forming metal line patterns on the first dielectric layer and a top surface of the conductive via to completely cover the conducive via Another aspect of the present disclosure includes a metal interconnect structure. The metal interconnect structure includes a semiconductor substrate. The metal interconnect structure also includes at least a conductive via formed on a surface of the semiconductor substrate. Further, the metal interconnect structure includes a first dielectric layer with a surface leveling with top surfaces of the conductive via formed on the surface of the semiconductor substrate. Further, the metal interconnect structure also includes metal line patterns completely covering the conductive via formed on the surface of the first dielectric layer and in a second dielectric layer formed on the top surface of the first dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
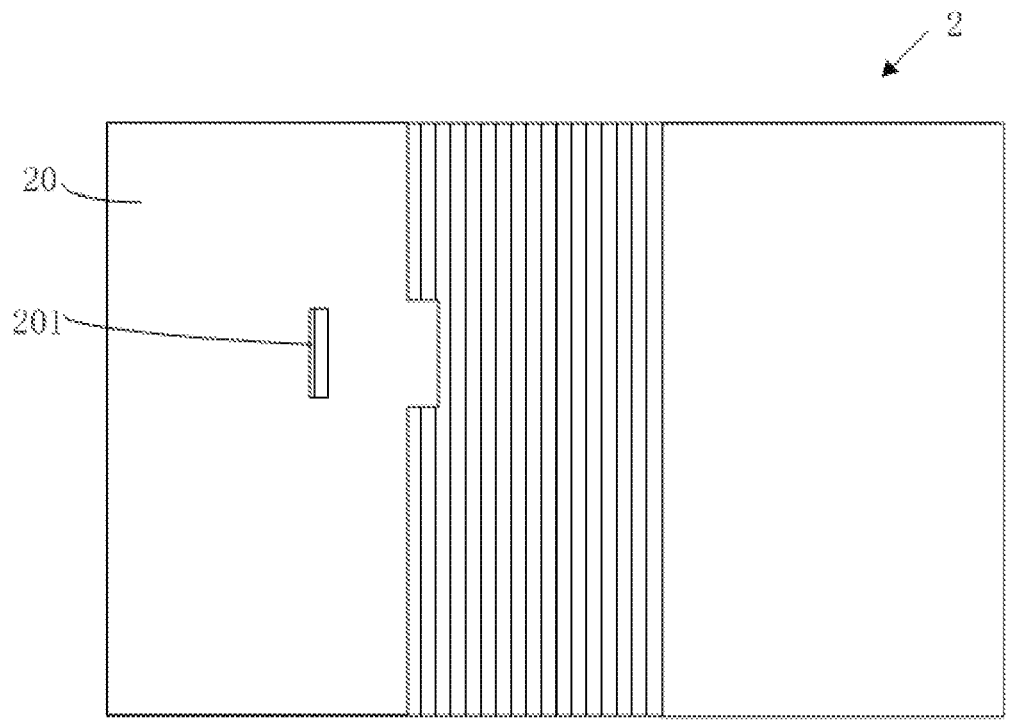
FIG. 1 illustrates a top view of a reticle after an optical proximity correction (OPC) process consistent with the disclosed embodiments.
Figure 8:
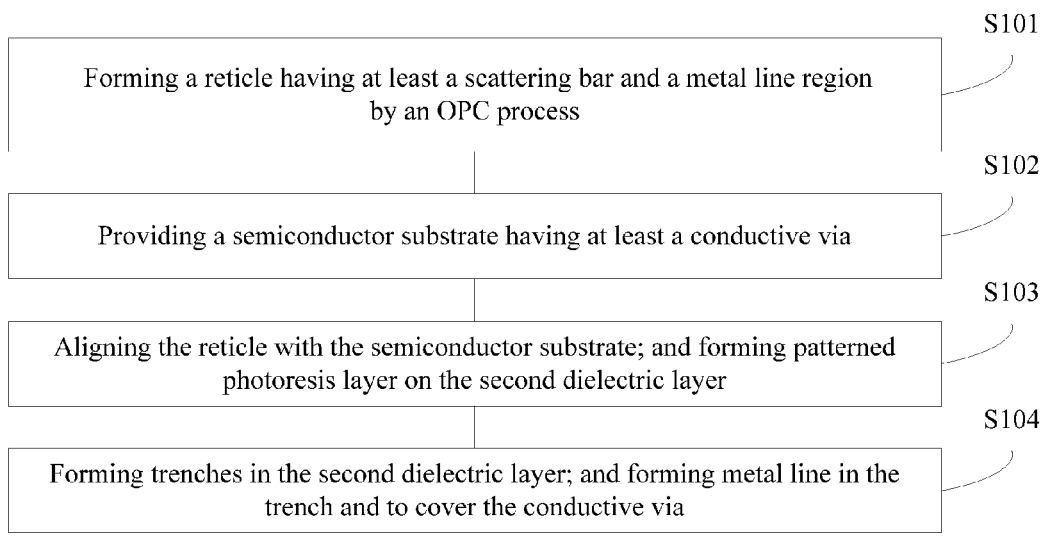
FIG. 8 illustrates an exemplary fabrication process of a metal interconnect structure formed by using a reticle obtained by an OPC method consistent with the disclosed embodiments.

FIG. 8 illustrates an exemplary fabrication process of a metal interconnect structure formed by using a reticle obtained by an OPC method consistent with the disclosed embodiments; and FIG. 1 illustrates a top view of the reticle obtained by the OPC method As shown in FIG. 8, at the beginning of the fabrication process, a reticle is fabricated (S101). FIG. 1 illustrates a corresponding reticle.

As shown in FIG. 1, a reticle 2 is fabricated. The reticle 2 includes a metal line region 20 and a metal slot 201. The metal line region 20 may include a plurality of line patterns (not labeled) for subsequently forming metal lines on a semiconductor substrate, and/or on conductive vias.

The metal slot 201 may be used to scatter the exposure light in the photoresist on a semiconductor substrate during the subsequent exposure process. Thus, the metal slot 201 may also be referred as a scattering bar (SB) 201. Further, the scattering bar 201 may be formed in the region without the dense metal line patterns (not labeled). That is, the scattering bar 201 is not formed in between adjacent metal line patterns, or it may be formed in between adjacent the metal line patterns with a relatively large line width. Thus, it may be appropriate to form the scattering bar 201 on the reticle 2 without affecting the line patterns with a substantially small line width, and/or other patterns during the subsequent exposure process.

Figure 2:
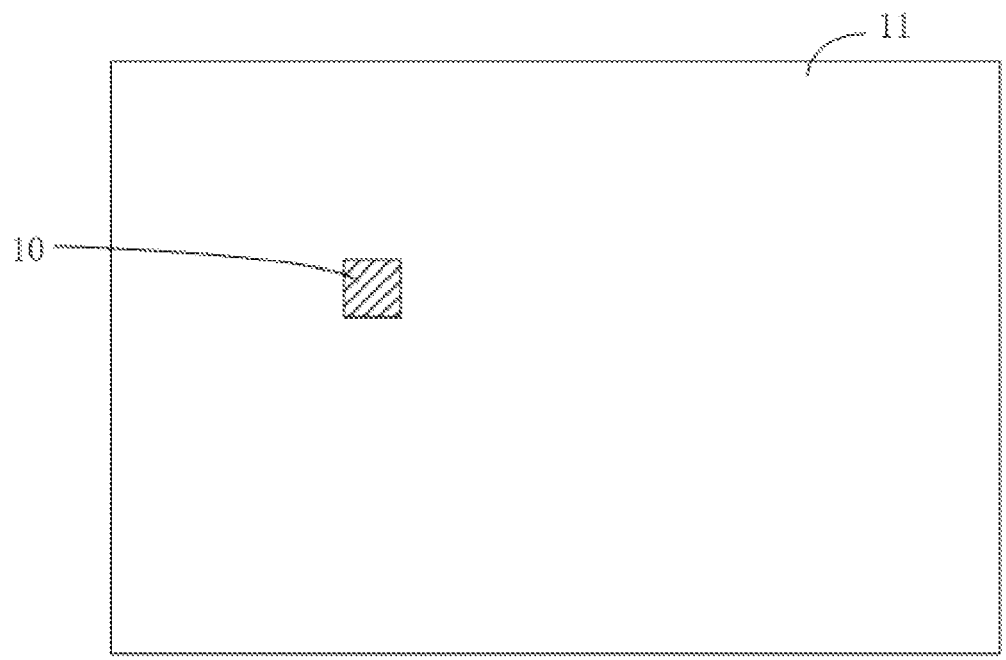
FIGS. 2-4 illustrate top views of structures corresponding certain stages of a fabrication process of a metal interconnect structure using the reticle illustrated in FIG. 1 consistent with the disclosed embodiments.
Figure 3:
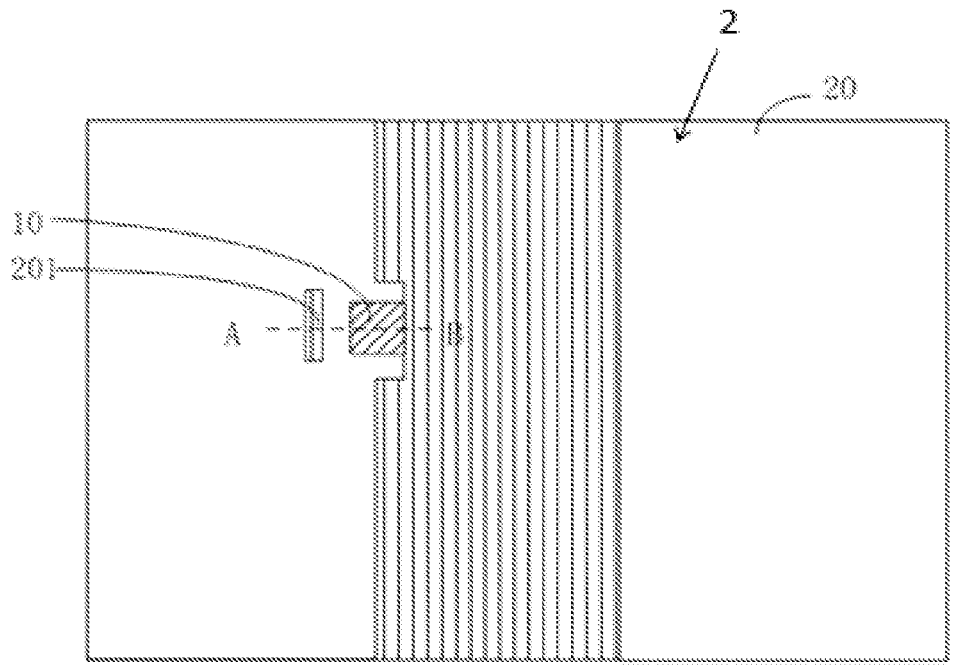
Figure 4:
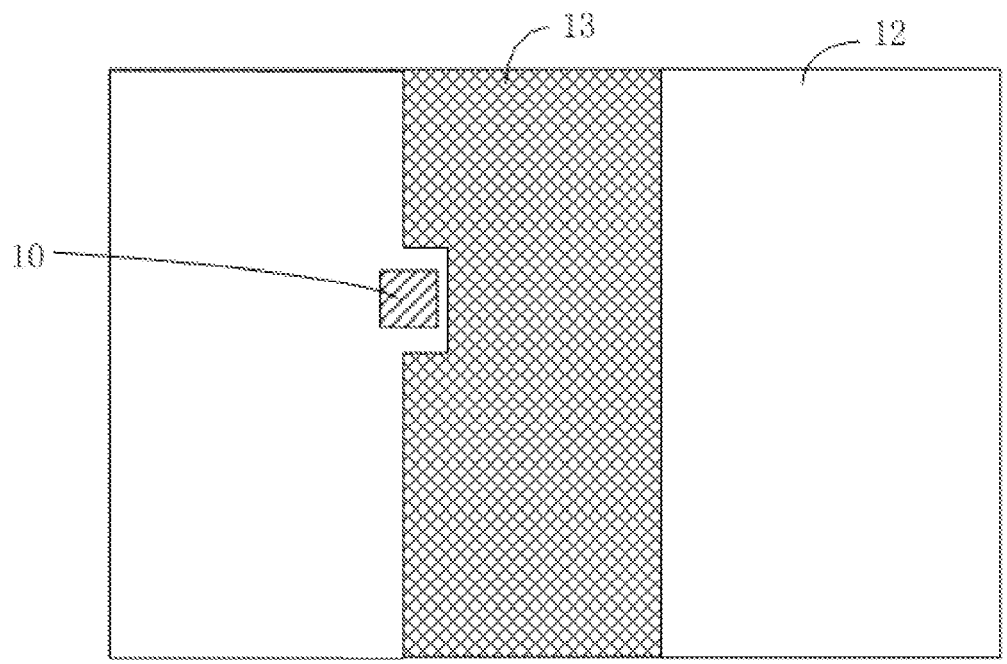

The reticle 2 having scattering bar 201 and the metal line region 20 may be obtained by an optical proximity correction (OPC) process. FIGS. 2-4 illustrate structures corresponding to certain stages of a method for obtaining the reticle 2 by the OPC process.

As shown in FIG. 2, at the beginning of the OPC process, a semiconductor substrate (not labeled) is provided. Further, a conducive via 10 and a first dielectric layer 11 are formed on the semiconductor substrate. That is, the conductive via 10 may be formed in a through-hole of the first dielectric layer 11. In one embodiment, the through-hole is rectangular shaped. In certain other embodiments, the through-hole may be circular, or other appropriate shapes.

The semiconductor substrate may include any appropriate semiconductor materials, such as silicon, silicon on insulator (SOI), silicon germanium, germanium on insulator (GOI), carborundum, indium antimonite, lead telluride, indium arsenide, indium phosphide, gallium arsenide, gallium nitride, gallium antimonite, alloy semiconductor or a combination thereof. The semiconductor substrate also provides a base for subsequent processes and structures. Further, semiconductor devices and/or interconnect structures may be formed in the semiconductor substrate and/or on the surface of the semiconductor substrate.

In one embodiment, the conductive via 10 may be directly formed on the surface of the semiconductor substrate. In certain other embodiments, the conductive via 10 may be formed on the metal line patterns of a device and/or a metal interconnect structure formed on the surface of the semiconductor substrate. Thus, the conductive via 10 may be used to electrically connect the semiconductor substrate, and/or the semiconductor devices with other devices, structures, and circuits, etc.

A process for forming the conductive via 10 may include, sequentially, forming the first dielectric layer 11 on the surface of the semiconductor substrate; forming a patterned mask layer having a pattern corresponding to a pre-determined contact spot of the surface of the semiconductor substrate on the first dielectric layer 11; etching the first dielectric layer 11 using the patterned mask layer until the surface of the contact spot on the surface of the semiconductor substrate is exposed to form a trench; and filling the trench with a metal material to form the contact via 10. The contact via 10 may be made of any appropriate material, such as Al, Cu, W, or Au, etc.

The first dielectric layer 11 may be made of any appropriate material, such as silicon oxide, silicon nitride, or silicon oxynitride, etc. In one embodiment, the first dielectric layer is made of silicon oxide.

Various processes may be used to form the first dielectric layer 11, such as a chemical vapor deposition (CVD) process, a physical vapor deposition (PVD) process, or an atomic layer deposition (ALD) process, etc. The first dielectric layer 11 may be etched by any appropriate process, such as a dry etching process, a wet etching process, or an ion beam etching process, etc.

Various processes may be used to form the conductive via 10, such as a PVD process, a CVD process, a sputtering process, or an electroplating process, etc. Optionally and additionally, after forming the conductive via 10, a chemical mechanical polishing process may be performed on the first dielectric layer 11 and the conductive via 10 to cause the top surface of the conductive via 10 to level with the top surface of the first dielectric layer 11.

After forming the contact via 10, a second dielectric layer and a photoresist layer may be formed; and FIG. 3 illustrates corresponding structures. For illustrative purposes, the second dielectric layer is described as transparent in FIG. 3.

As shown in FIG. 3, the second dielectric layer 12 may be formed on the first dielectric layer 11. The second dielectric layer 12 may be made of any appropriate material, such as silicon oxide, silicon nitride, or silicon oxynitride, etc. Various processes may be used to form the second dielectric layer 12, such as a CVD process, a PVD process, or an ALD process, etc.

Further, after forming the second dielectric layer 12, a photoresist layer (not shown) may be formed on the surface of the second dielectric layer 12. The photoresist layer may be made of positive photoresist, or negative photoresist, etc. In one embodiment, a positive photoresist layer is formed on the second dielectric layer 12. The photoresist layer may be formed by a spin-coating process; and followed by a soft baking process and/or a hard baking process.

After forming the photoresist layer, an initial reticle 2 is provided. The initial reticle 2 may have an initial scattering bar 201 and the metal line pattern region 20. The initial scattering bar 201 may have initially set position, length, and line width, etc.

The metal line patterns and the initial scattering bar 201 may be formed on a reticle substrate. The reticle substrate may be made of any appropriate transparent material, such as glass, quartz, fused silica, or plastic, etc. Various processes may be used to form the metal line patterns and the initial scattering bar 201 on the reticle substrate, such as a direct laser writing process, or an electron beam lithography process, etc. The metal line patterns and the initial scattering bar 201 may be made of any appropriate material, such as Cr, Co, or Ti, etc.

After providing the initial reticle 2, the initial reticle 2 may be aligned with the semiconductor substrate. The corresponding structure is referred to FIG. 3.

As shown in FIG. 3, the initial reticle 2 is aligned with the semiconductor substrate. Specifically, the initial scattering bar 201 on the initial reticle 2 may be aligned near to the conductive via 10. The alignment between the semiconductor substrate and the reticle 2 may be performed by any appropriate photolithography apparatus.

As shown in FIG. 4, after aligning the initial reticle 2 with the semiconductor substrate, an exposure process may be performed; and a patterned photoresist layer 13 may be formed on the second dielectric layer 12.

In one embodiment, the photoresist layer is positive photoresist, the metal line pattern region 20 of the initial reticle 2 is a transparent region; and the initial scattering bar 201 is an opaque region. As shown in FIG. 4, after the exposure process, the photoresist under the transparent region may become soluble to a developer; and may be removed by a subsequent process. The region at the outside of the metal line pattern region 20 may be an opaque region.

Thus, it may be kept to form the patterned photoresist layer 13 after the exposure process.

Although the scattering bar 201 is opaque, by controlling the size of the scattering bar 201, it may only function to adjust the light intensity distribution of the photoresist layer on the conductive via 10; and may not be developed to form a pattern in the photoresist. Such an adjusted light intensity distribution may be able to cause the patterned photoresist 13 to shrink to a certain extent to entirely expose the conductive via 10. Thus, the subsequently formed metal line patterns may completely cover the conductive via 10. Further, the shrinking extent of the patterned photoresist layer 13 may not cause the patterned photoresist to have a peeling issue. Thus, the subsequently formed line patterns may not be shorted. In one embodiment, the width of the scattering bar 201 may be in a range of approximately 15 nm~30 nm. The distance between adjacent metal line patterns may be in a range of approximately 30 nm~100 nm.

In certain other embodiments, the photoresist layer is negative photoresist, the metal line region 20 is an opaque region; and the scattering bar 201 is transparent. The patterned photoresist layer 13 formed by the negative photoresist may also be able to entirely expose the conductive via 10; and the adjacent metal line patterns may be not be shorted.

Further, after forming the patterned photoresist layer 13, trenches (not shown) may be formed in the second dielectric layer 12; and metal line patterns may be formed in the trenches by filling the trenches using a metal material. The metal line patterns may electrically contact with the conductive via 10.

The metal line patterns formed by using the initial reticle 2 with the scattering bar 201 may entirely cover the conductive via 10; and the adjacent metal line patterns may not contact with each other, i.e., the patterned photoresist layer may not have a peeling issue. Such conditions may be referred that the reticle 2 (or the scattering bar 201) matches desired requirements.

If the metal line patterns formed on the semiconductor substrate using the initial having the initial scattering bar 201 with the initially set position, length and width, etc., match the desired requirements, the scattering bar 201 with the initially set position, length, and width may be used on the reticle 2. That is, the initial recticle 2 may be fabricated; and used as the recticle to for forming metal interconnect structure; and the OPC process of the reticle 2 may be finished.

If the metal lines formed on the semiconductor substrate does not match the desired requirements, the initial position, length and width of the scattering bar 201 may be adjusted; and another initial reticle 2 may be formed. Then, metal line patterns may be formed on a semiconductor substrate having a conductive via by a previously described processes. The adjustment of the initial scattering bar 201 and the formation of metal line patterns may be repeated until the metal line patterns formed on the semiconductor substrate matched the desired requirements. Thus, the eventually obtained scattering bar 201 may be used on the reticle 2. That is, the reticle 2 is fabricated, and the OPC process may be finished.

During the adjustment of the initial position, length and width of the scattering bar 201, two parameters of the initial position, length and width may be fixed, and the third one may be approached step-by-step until the metal line patterns formed on the semiconductor substrate match the desired requirements. Thus, the adjusted position, length, and width of the scattering bar 201 may be used to form the scattering bar 201 on the reticle 2.

In certain other embodiments, the method for obtaining the reticle 2 by an OPC process may include obtaining the initial position, length and width of the scattering bar 201 by experience; and then the position, the length and the width of the scattering bar 201 may be approached step-by-step within the available values until the requirements are matched. Thus, the obtained position, the length and the width of the scattering bar 201 may be used to form the scattering bar 201 on the reticle 2.

Referring to FIG. 3, the scattering bar 201 may be a long stripe, the direction of the scatter bar 201, i.e., a direction parallel to the long side of the stripe, may be parallel to the direction of the metal line pattern region 20 at the contact spot of the conductive via 10. As used herein, the direction of the metal line pattern region 20 at the contact spot of the conductive via 10 may refer to the extension direction of the metal line pattern region 20 at the contact spot of the conductive via 10. The connection line between the center of the scattering bar 201 and the center of the conducive via 10 may be referred as "AB". Thus, the direction of the metal line pattern region 20 at the contact spot of the conductive via 10 may refer to a direction perpendicular to the direction of "AB". Such a scattering bar 201 with the position, length and width obtained by the OPC process may improve the light intensity distribution of the photoresist layer on the conductive via 10. Thus, the incomplete coverage issue of the conductive via 10 may be avoided. Further, the peeling issue of the line patterns of the patterned photoresist 13 may also be avoided.

Returning to FIG. 8, after fabricating the reticle 2, a semiconductor substrate having certain structures may be provided (102). Metal line patterns may be formed on the semiconductor substrate. For example, a semiconductor substrate similar as the semiconductor substrate illustrate in FIG. 2 may be provided. That is, the semiconductor substrate may have a conductive via. Metal line patterns may be formed on the semiconductor substrate having a conductive via using the reticle 2 fabricated by the OPC process.

A first dielectric layer may be formed on the semiconductor substrate; and the conductive via may be formed in the first dielectric layer on the semiconductor substrate. The conductive via may be electrically connected with the devices formed in and/or on the semiconductor substrate. Further, a second dielectric layer may be formed on the first dielectric layer and the conductive via. Further, a photoresist layer may be formed on the second dielectric layer.

Returning to FIG. 8, after forming the photoresist layer, the reticle 2 obtained by the OPC process may be aligned with the semiconductor substrate having the photoresist layer (S103). A similar structure of the semiconductor substrate aligned with the reticle 2 having the scattering bar 201 and the metal line pattern region 20 may be referred to FIG. 3. The scattering bar 201 may be aligned near to the conductive via. The alignment between the semiconductor substrate and the reticle 2 may be performed by any appropriate photolithography apparatus.

After aligning the reticle 2 with the semiconductor substrate, an exposure and developing process may be performed on the photoresist layer to form a patterned photoresist layer. As described previously, the pattern of the scattering bar 201 may not be transferred to the patterned photoresist layer; and only metal line patterns may be transferred to the photoresist layer. After the developing process, the metal line patterns may be formed in the photoresist layer; and a portion of the second dielectric layer corresponding to the metal line pattern may be exposed.

Returning to FIG. 8, after forming the patterned photoresist layer, trenches may be formed in the second dielectric layer; and metal lines may be formed in the trenches on semiconductor substrate (S104). A similar corresponding structure may be referred to FIG. 4.

The trenches may be formed in the second dielectric layer by etching the second dielectric layer using the patterned photoresist layer as an etching process. A portion of the surface of the semiconductor substrate and the surface of the conductive via may be exposed. By controlling the shape of the patterned photoresist layer formed using the reticle 2 obtained by the OPC process, the trenches formed in the second dielectric layer 12 using the patterned photoresist layer may cover the entire surface of the conductive via 10. Further, the second dielectric layer 12 between adjacent trenches may not have a significantly large shrinkage to cause the subsequently formed metal line patterns to be shorted. Thus, the interconnect performance of the metal interconnect structure.

After forming the trenches, metal lines may be formed in the trenches. The metal lines may be electrically connected with the conductive via. Further, after forming the metal line patterns, the patterned photoresist layer may be removed; and followed by removing a portion of the metal line patterns higher than the top surface of the second dielectric layer. The patterned photoresist layer may be removed by any appropriate process, such as a dry etching process, or a wet etching process. In one embodiment, the patterned photoresist layer is removed by a plasma ashing process.

The metal line patterns higher than the top surface of the second dielectric layer may be removed by any appropriate process, such as a CMP process, or a physical mechanical polishing process. In one embodiment, a CMP process is used to remove the metal line patterns higher than the top surface of the second dielectric layer.

Because the metal lines are formed by using the reticle 2 fabricated by the OPC process, the surface of the conductive via may be completely covered. Further, the adjacent metal line may not connect. Thus, the performance of the metal interconnect structure may be improved.

Thus, a metal interconnect structure may be formed by the above disclosed processes and methods; and the corresponding metal interconnect structure is partially illustrated in FIG. 4. As shown in FIG. 4, the metal interconnect structure includes a semiconductor substrate (not labeled); and a first dielectric layer (not labeled) formed on the semiconductor substrate. The metal interconnect structure also includes at least a conductive via 10 with a top surface leveling with the top surface of the first dielectric layer on the semiconductor substrate and a second dielectric layer 12 formed on the surface of the first dielectric layer. Further, the metal interconnect structure includes metal line patterns (not shown) formed in the second dielectric layer 12 and on the conductive via 10. A reticle obtained by an OPC process are used to form the patterns photoresist layer 13 for forming the metal line patterns to cause the top surface of the conductive via 10 to be completely covered by the metal line patterns. The detailed structures and intermediate structures are described above with respect to the fabrication processes.

Figure 5:
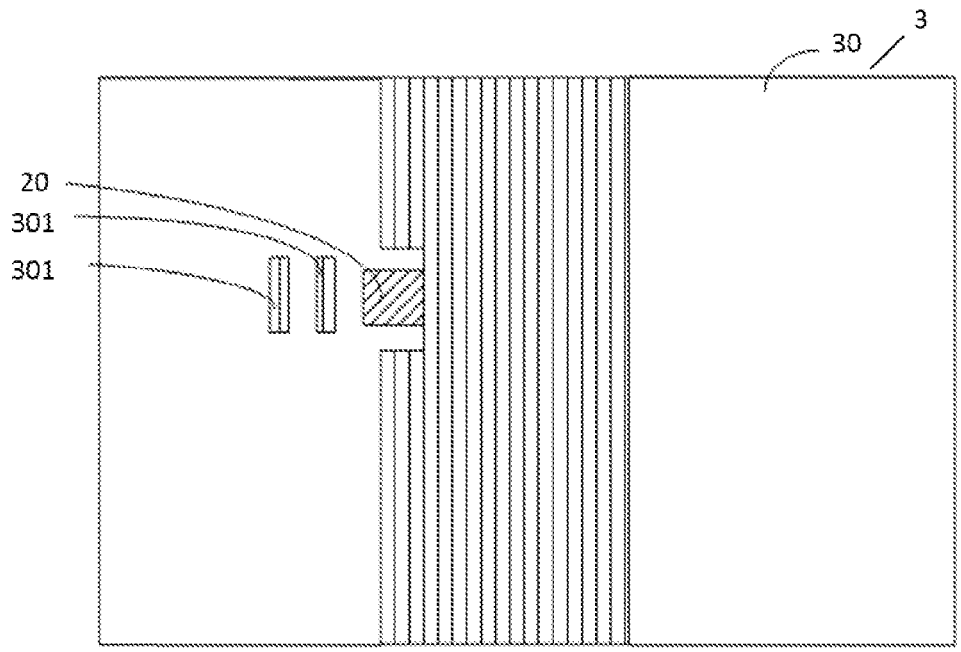
FIG. 5 illustrates another metal interconnect structure formed by using a reticle obtained by an OPC method consistent with the disclosed embodiments.

FIG. 5 illustrates a structure corresponding to another exemplary fabrication of a metal interconnect structure consistent with the disclose embodiments. At the beginning of the fabrication process, a reticle and a semiconductor substrate are provided.

As shown in FIG. 5, a reticle 3 is provided. The reticle 3 includes a metal line region 30, and two metal slots 301. The metal line region 30 may include a plurality of line patterns (not labeled) for subsequently forming metal line patterns on a semiconductor substrate. The two metal slots 301 may be used to scatter the exposure light in the photoresist on the semiconductor substrate during the subsequent exposure process. Thus, the metal slots 301 may also be referred as scattering bars 301. Further, the scattering bars 301 may be formed in the region without the dense metal line patterns (not labeled). That is, the scattering bars 301 are not formed in between adjacent metal line patterns; or they may be formed in between adjacent the metal line patterns with a relatively large line width. Thus, it may be appropriate to form the scattering bars 301 on the reticle 3 without affecting the line patterns with a substantially small line width, and/or other patterns during the subsequent exposure process. Further, the two scattering bars 301 may be parallel to each other.

The reticle 3 having the scattering bars 301 and the metal line corresponding region 30 may be fabricated by an optical proximity correction (OPC) process. One method for obtaining the reticle 3 by the OPC process may include setting the initial position, length and width of the scattering bars 301. If the metal line corresponding region 30 matches the desired requirements after forming the metal line patterns on a semiconductor substrate using the two scattering bars 301 with the initially set position, length and width, etc., the two scattering bars 301 with the initially set position, length and width may be formed on the reticle 3. If the metal line region 30 does not match the desired requirements, the initial position, length and width of the scattering bars 301 may be adjusted. Such adjustments may be repeated until the metal line corresponding region 30 matches desired requirements. As used herein, the desired requirements may refer that the metal lines patterns formed using the reticle 3 with the two scattering bars 301 obtained by the OPC process may entirely cover a conductive via on the semiconductor substrate; and the adjacent metal line patterns may not connect with each other.

In certain other embodiments, the method for fabricating the reticle 3 by an OPC process may include obtaining the initial position, length and width of the scattering bars 301 by experience; and then the position, the length and the width of the scattering bars 301 may be approached step-by-step within the available values until the desired requirements are matched. Thus, the obtained position, the length and the width of the scattering bars 301 may be used to form the scattering bars 301 on the reticle 3.

The metal line patterns and the scattering bars 301 may be formed on a substrate (not labeled). The substrate may be made of any appropriate transparent material, such as glass, quartz, fused silica, or plastic, etc. Various processes may be used to form the metal line patterns and the scattering bars 301, such as a direct laser writing process, or an electron beam lithography process, etc. The line patterns and the scattering bars 301 may be made of any appropriate material, such as, Cr, Co, or Ti, etc.

Further, a semiconductor substrate having a similar structure as the semiconductor substrate for obtaining the reticle 3 (not labeled) is provided, and a conducive via 20 and a first dielectric layer (not shown) are formed on the semiconductor substrate. That is, the conductive via 20 may be formed in a through hole of the first dielectric layer. In one embodiment, the through hole is rectangular. In certain other embodiments, the through hole is circular, or other appropriate shape.

In one embodiment, the conductive via 20 may be directly formed on the surface of the semiconductor substrate. In certain other embodiments, the conductive via 20 may be formed on the metal line pattern of a device, and/or a metal interconnect structure formed on the surface of the semiconductor substrate. Thus, the conductive via 20 may be used to electrically connect the semiconductor substrate, and/or the semiconductor devices with other devices, structures and circuits, etc.

The first dielectric layer may be made of any appropriate material, such as silicon oxide, silicon nitride, or silicon oxynitride, etc. In one embodiment, the first dielectric layer is made of silicon oxide.

Various processes may be used to form the first dielectric layer, such as a chemical vapor deposition (CVD) process, a physical vapor deposition (PVD) process, or atomic layer deposition (ALD) process, etc. The first dielectric layer may be etched by any appropriate process, such as a dry etching process, a wet etching process, or an ion beam etching process, etc.

Various processes may be used to form the conductive via 20, such as a PVD process, a CVD process, a sputtering process, or an electric plating process, etc. Optionally and additionally, after forming the conductive via 20, a chemical mechanical polishing process may be performed on the first dielectric layer and the conductive via 20 to cause the top surface of the conductive via 20 to level with the top surface of the first dielectric layer.

Further, after forming the contact via 20, a second dielectric layer (treated as transparent) may be formed on the first dielectric layer and a photoresist layer may be formed on the second dielectric layer. The second dielectric layer 12 may be made of any appropriate material such as silicon oxide, silicon nitride, or silicon oxynitride, etc. Various processes may be used to form the second dielectric layer, such as a CVD process, a PVD process, or an ALD process, etc. The photoresist layer may be made of positive photoresist, or negative photoresist, etc. The photoresist layer may be formed by a spin-coating process; and followed by a soft baking process; and/or a hard baking process.

Further, after forming the photoresist layer, the reticle 3 with the two scattering bars 301 obtained by the OPC process may be aligned with the semiconductor substrate having the photoresist layer. FIG. 5 illustrates a structure of the semiconductor substrate having the conductive via 20 aligned with the reticle 3 having the two scattering bars 301 and the metal line region 30. The two scattering bars 301 may be aligned near to the conductive via 20. The alignment between the semiconductor substrate and the reticle 3 with the two scattering bars 301 may be performed by any appropriate photolithography apparatus.

Further, after aligning the reticle 3 with the two scattering bars 301 obtained by the OPC process, an exposure process may be performed; and a patterned photoresist layer (not shown) may be formed on the second dielectric layer. Referring to FIG. 5, the two scattering bars 301 with the pre-determined position, length and width obtained by an OPC process may improve the light intensity distribution of the photoresist layer on the conductive via 20. Thus, the incomplete coverage issue of the conductive via 20 may be avoided. Further, the peeling issue of the line patterns of the patterned photoresist may also be avoided. Thus, the subsequently formed metal line patterns on the semiconductor substrate may not be shorted.

Further, after forming the patterned photoresist layer, trenches (not shown) may be formed in the second dielectric layer; and metal line patterns may be formed in the trenches by filling the trenches using a metal material. The metal line patterns may electrically contact with the conductive via 20.

Further, after forming the metal line patterns, the patterned photoresist layer may be removed; and followed by removing a portion of the metal line patterns higher than the top surface of the second dielectric layer. The patterned photoresist layer may be removed by any appropriate process, such as a dry etching process, or a wet etching process. In one embodiment, the patterned photoresist layer is removed by a plasma ashing process.

The metal line patterns higher than the top surface of the second dielectric layer may be removed by any appropriate process, such as a CMP process, or a physical mechanical polishing process. In one embodiment, a CMP process is used to remove the metal line patterns higher than the top surface of the second dielectric layer.

By controlling the shape of the patterned photoresist layer formed by using the reticle 3 with the two scattering patterns 301 obtained by the OPC process, the trenches formed in the second dielectric layer using the patterned photoresist layer may cover the entire surface of the conductive via 20. Further, the second dielectric layer between adjacent trenches may not have a significantly large shrinkage to cause the subsequently formed metal line patterns to be shorted. Thus, the interconnect performance of the metal interconnect structure may be improved.

Figure 6:
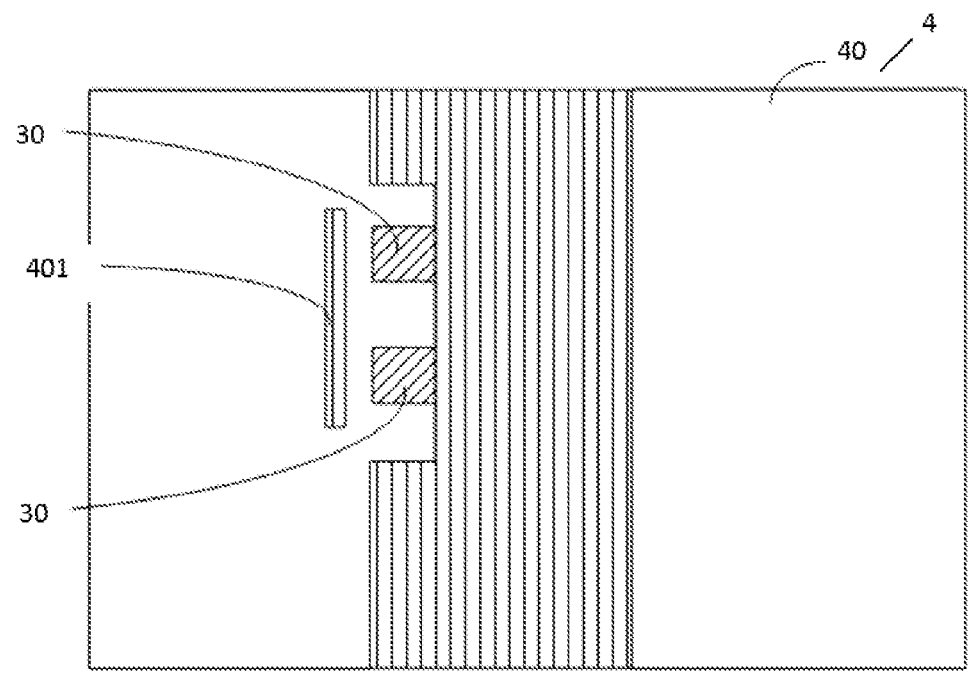
FIG. 6 illustrates another metal interconnect structure formed by using the a reticle obtained by an OPC method consistent with the disclosed embodiments.

FIG. 6 illustrates a structure corresponding to another exemplary fabrication of a metal interconnect structure consistent with the disclosed embodiments. At the beginning of the fabrication process, a reticle and a semiconductor substrate are provided.

As shown in FIG. 6, a reticle 4 is provided. The reticle 4 includes a metal line region 40 and a long metal slot 401. The metal line region 40 may include a plurality of line patterns (not labeled) for subsequently forming metal line patterns on a semiconductor substrate. The long metal slot 401 may be used to scatter the exposure light in the photoresist on the semiconductor substrate during the subsequent exposure process. Thus, the long metal slot 401 may also be referred as a long scattering bar 401. The long scattering bar 401 may be equal to two continuous scattering bars for scattering light during a subsequent process for forming metal line patterns on two conductive vias. Using the long scattering bar 401 to substitute two scattering bars may reduce the production cost of the scattering bar 401. Further, the long scattering bar 401 is formed in the region without the dense metal line patterns (not labeled). That is, the long scattering bar 401 may not be formed in between adjacent metal line patterns; or they may be formed in between the adjacent metal line patterns with a relatively large line width. Thus, it may be appropriate to form the long scattering bar 401 on the reticle 4 without affecting the line patterns with a substantially small line width, and/or other patterns during the subsequent exposure process.

The reticle 4 having the long scattering bar 401 and the metal line region 40 may be obtained by an optical proximity correction (OPC) process. One method for obtaining the reticle 4 with the long scattering bar 401 by the OPC process may include setting the initial position, length and width of the long scattering bar 401. If the metal line region 40 matches the desired requirements after forming the metal lines on a semiconductor substrate using the reticle 4, the long scattering bar 401 with the initially set position, length and width may be formed on the reticle 4. If the metal line region 40 does not match the desired requirements, the initial position, length and width of the long scattering bar 401 may be adjusted. The adjustment may be repeated until the metal line region 40 matches desired requirements. As used herein, the desired requirements may refer that the metal lines patterns formed by using the reticle 4 with the long scattering bar 401 obtained by the OPC process may entirely cover two conductive vias; and the adjacent metal line patterns may not connect each other.

In certain other embodiments, the method for obtaining the reticle 4 with the long scattering bar 401 by an OPC process may include obtaining the initial position, length and width of the long scattering bar 401 by experience; and then the position, the length and the width of the long scattering bar 401 may be approached step-by-step within the available values until the requirements are matched. Thus, the obtained position, the length and the width of the long scattering bar 401 may be used to form the long scattering bar on the reticle 4.

The metal line patterns and the long scattering bar 401 may be formed on a substrate (not labeled). The substrate may be made of any appropriate transparent material, such as glass, quartz, fused silica, or plastic, etc. Various processes may be used to form the metal line patterns and the long scattering bar 401, such as a direct laser writing process, or an electron beam lithography process, etc. The line patterns and the long scattering bar 401 may be made of any appropriate material, such as, Cr, Co, or Ti, etc.

Further, a semiconductor substrate similar as the semiconductor substrate used for forming the reticle 4 (not labeled) is provided, and two conducive vias 30 and a first dielectric layer (not shown) are formed on the semiconductor substrate. That is, the two conductive vias 30 may be formed in two through-holes of the first dielectric layer. In one embodiment, the through-holes are rectangular. In certain other embodiments, the through-holes are circular, or other appropriate shape.

In one embodiment, the two conductive vias 30 may be directly formed on the surface of the semiconductor substrate. In certain other embodiments, the two conductive vias 30 may be formed on the metal line pattern of a device, and/or a metal interconnect structure formed on the surface of the semiconductor substrate. Thus, the two conductive vias 30 may be used to electrically connect the semiconductor substrate, and/or the semiconductor devices with other devices, structures and circuits, etc.

The first dielectric layer may be made of any appropriate material, such as silicon oxide, silicon nitride, or silicon oxynitride, etc. In one embodiment, the first dielectric layer is made of silicon oxide.

Various processes may be used to form the first dielectric layer, such as a chemical vapor deposition (CVD) process, a physical vapor deposition (PVD) process, or atomic layer deposition (ALD) process, etc. The first dielectric layer may be etched by any appropriate process, such as a dry etching process, a wet etching process, or an ion beam etching process, etc.

Various processes may be used to form the two conductive vias 30, such as a PVD process, a CVD process, a sputtering process, or an electroplating process, etc. Optionally and additionally, after forming the two conductive vias 30, a chemical mechanical polishing process (CMP) may be performed onto the first dielectric layer and the two conductive vias 30 to cause the top surfaces of the two conductive vias 30 to level with the top surface of the first dielectric layer.

Further, after forming the two conductive vias 30, a second dielectric layer (treated as transparent) may be formed on the first dielectric layer; and a photoresist layer may be formed on the second dielectric layer. The second dielectric layer may be made of any appropriate material, such as silicon oxide, silicon nitride, or silicon oxynitride, etc. Various processes may be used to form the second dielectric layer, such as a CVD process, a PVD process, or an ALD process, etc. The photoresist layer may be made of positive photoresist, or negative photoresist, etc. The photoresist layer may be formed by a spin-coating process; and followed by a soft baking process, and/or a hard baking process.

Further, after forming the photoresist layer, the reticle 4 with the long scattering bar 401 obtained by the OPC process may be aligned with the semiconductor substrate having the photoresist layer. FIG. 6 illustrates a structure of the semiconductor substrate having the two conductive vias 30 aligned with the reticle 4 having the long scattering bar 401 and the metal line region 40. The long scattering bar 401 may be aligned near to the two conductive vias 30. The alignment between the semiconductor substrate and the reticle 4 with the long scattering bar 401 may be performed by any appropriate photolithography apparatus.

Further, after aligning the reticle 4 with the long scattering bar 401 obtained by the OPC process, an exposure process may be performed; and a patterned photoresist layer (not shown) may be formed on the second dielectric layer. Referring to FIG. 6, the long scattering bar 401 with the pre-determined position, length and width obtained by an OPC process may improve the light intensity distribution of the photoresist layer on the two conductive vias 30. Thus, the incomplete coverage issue of the two conductive vias 30 may be avoided. Further, the peeling issue of the line patterns of the patterned photoresist layer may also be avoided. Thus, the subsequently formed metal line patterns on the semiconductor substrate may not be shorted.

Further, after forming the patterned photoresist layer, trenches (not shown) may be formed in the second dielectric layer; and metal line patterns may be formed in the trenches by filling the trenches using a metal material. The metal line patterns may electrically contact with the two conductive vias 30.

Further, after forming the metal line patterns, the patterned photoresist layer may be removed; and followed by removing a portion of the metal line patterns higher than the top surface of the second dielectric layer. The patterned photoresist layer may be removed by any appropriate process, such as a dry etching process, or a wet etching process. In one embodiment, the patterned photoresist layer is removed by a plasma ashing process.

The metal line patterns higher than the top surface of the second dielectric layer may be removed by any appropriate process, such as a CMP process, or a physical mechanical polishing process. In one embodiment, a CMP process is used to remove the metal line patterns higher than the top surface of the second dielectric layer.

By controlling the shape of the patterned photoresist layer formed by using the reticle 4 with the long scattering bar 401 obtained by the OPC process, the trenches formed in the second dielectric layer using the patterned photoresist layer may cover the entire surfaces of the two conductive vias 30. Further, the second dielectric layer between adjacent trenches may not have a significantly large shrinkage to cause the subsequently formed metal line patterns to be shorted. Thus, the interconnect performance of the metal interconnect structure may be improved.

Figure 7:
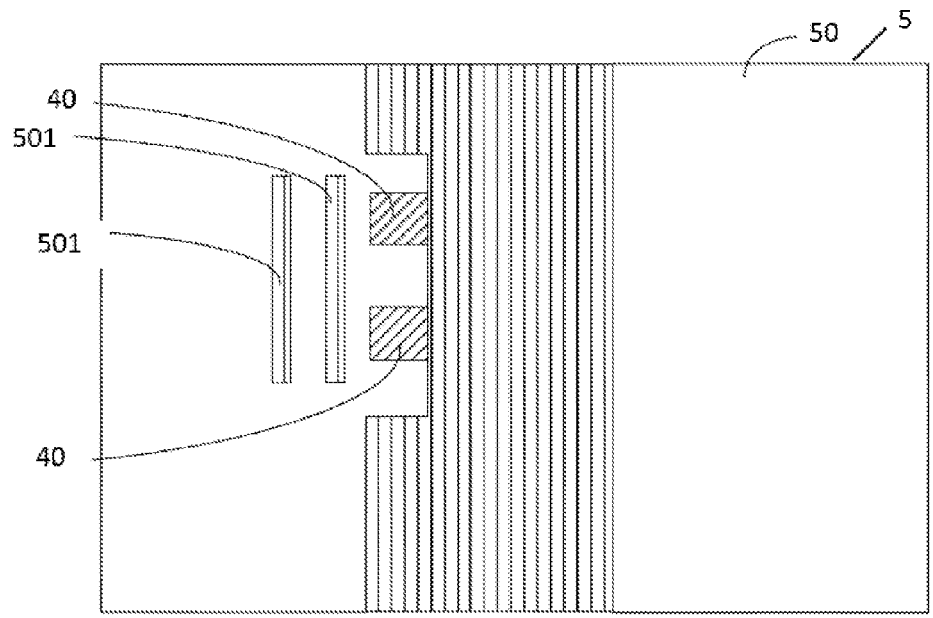
FIG. 7 illustrates another metal interconnect structure formed by using the a reticle obtained by an OPC method consistent with the disclosed embodiments.

FIG. 7 illustrates a structure corresponding to another exemplary fabrication of a metal interconnect structure consistent with the disclose embodiments. At the beginning of the fabrication process, a reticle and a semiconductor substrate are provided.

As shown in FIG. 7, a reticle 5 is provided. The reticle 5 includes a metal line region 50 and two long metal slots 501. The metal line region 50 may include a plurality of line patterns (not labeled) for subsequently forming metal lines on a semiconductor substrate. The two long metal slots 501 may be used to scatter the exposure light in the photoresist on the semiconductor substrate during the subsequent exposure process. Thus, the two long metal slots 501 may also be referred as long scattering bars 501. Any one of the long scattering bars 501 may be equal to two continuous scattering bars to scattering light during a subsequent process for forming metal line patterns on two conductive vias. Using the two long scattering bars 501 to substitute four scattering bars may reduce the production cost of the two long scattering bars 501. Further, the two long scattering bars 501 are formed in the region without the dense metal line patterns (not labeled). That is, the two long scattering bars 501 are not formed in between adjacent metal line patterns; or they may be formed in between adjacent metal line patterns with a relatively large line width. Thus, it may be appropriate to form the two long scattering bars 501 on the reticle 5 without affecting the line patterns with a substantially small line width, and/or other patterns during the subsequent exposure process.

The reticle 5 having the two long scattering bars 501 and the metal line pattern region 50 may be obtained by an optical proximity correction (OPC) process. One method for obtaining the reticle 5 with the long scattering bar 501 by the OPC process may include setting the initial position, length and width of the two long scattering bars 501. If the metal line region 50 matches the desired requirements after forming the metal line patterns on the semiconductor substrate using the reticle 50 with the two long scattering bars 501, the two long scattering bars 501 with the initially set position, length and width may be formed on the reticle 5. If the metal line region 50 does not match the desired requirements, the initial position, length and width of the long scattering bars 501 may be adjusted. The adjustment may be repeated until the metal line region 50 matches desired requirements. As used herein, the desired requirements may refer that the metal lines patterns formed by using the reticle 5 with the two long scattering bars 501 obtained by the OPC process may entirely cover two conductive vias; and the adjacent metal line patterns may not connect with each other.

In certain other embodiments, the method for obtaining the reticle 5 with the two long scattering bars 501 by an OPC process may include obtaining the initial position, length and width of the long scattering bars 501 by experience; and then the position, the length and the width of the two long scattering bars 501 may be approached step-by-step within the available values until the requirements are matched. Thus, the obtained position, the length and the width of the long scattering bars 501 may be used to form the two long scattering bars 501 on the reticle 5.

The metal line patterns and the two long scattering bars 501 may be formed on a substrate (not labeled). The substrate may be made of any appropriate transparent material, such as glass, quartz, or plastic, etc. Various processes may be used to form the metal line patterns and the two long scattering bars 501, such as a direct laser writing process, or an electron beam lithography process, etc. The metal line patterns and the two scattering bars 501 may be made of any appropriate material, such as, Cr, Co, or Ti, etc.

Further, a semiconductor substrate similar as the semiconductor substrate used for obtaining the reticle 5 (not labeled) is provided, and two conducive vias 40 and a first dielectric layer (not shown) are formed on the semiconductor substrate. That is, the two conductive vias 40 may be formed in two through-holes of the first dielectric layer. In one embodiment, the two through-holes are rectangular. In certain other embodiments, the two through-holes are circular, or other appropriate shape.

In one embodiment, the two conductive vias 40 may be directly formed on the surface of the semiconductor substrate. In certain other embodiments, the two conductive vias 40 may be formed on the metal line pattern of a device, and/or a metal interconnect structure formed on the surface of the semiconductor substrate. Thus, the two conductive vias 40 may be used to electrically connect the semiconductor substrate, and/or the semiconductor devices with other devices, structures, and circuits, etc.

The first dielectric layer may be made of any appropriate material, such as silicon oxide, silicon nitride, or silicon oxynitride, etc. In one embodiment, the first dielectric layer is made of silicon oxide.

Various processes may be used to form the first dielectric layer, such as a chemical vapor deposition (CVD) process, a physical vapor deposition (PVD) process, or atomic layer deposition (ALD) process, etc. The first dielectric layer may be etched by any appropriate process, such as a dry etching process, a wet etching process, or an ion beam etching process, etc.

Various processes may be used to form the two conductive vias 40, such as a PVD process, a CVD process, a sputtering process, or an electroplating process, etc. Optionally and additionally, after forming the two conductive vias 40, a chemical mechanical polishing process (CMP) may be performed on to the first dielectric layer and the two conductive vias 40 to cause the top surfaces of the two conductive vias 40 to level with the top surface of the first dielectric layer.

Further, after forming the two conductive vias 40, a second dielectric layer (treated as transparent) may be formed on the first dielectric layer and a photoresist layer may be formed on the second dielectric layer. The second dielectric layer may be made of any appropriate material, such as silicon oxide, silicon nitride, or silicon oxynitride, etc. Various processes may be used to form the second dielectric layer, such as a CVD process, a PVD process, or an ALD process, etc. The photoresist layer may be made of positive photoresist, or negative photoresist, etc. The photoresist layer may be formed by a spin-coating process; and followed by a soft baking process, and/or a hard baking process.

Further, after forming the photoresist layer, the reticle 5 with the two long scattering bars 501 obtained by the OPC process may be aligned with the semiconductor substrate having the photoresist layer. FIG. 7 illustrates a structure of the semiconductor substrate having the two conductive vias 40 aligned with the reticle 5 having the two long scattering bars 501 and the metal line corresponding region 50. The two long scattering bars 501 may be aligned near to the two conductive vias 40. The alignment between the semiconductor substrate and the reticle 5 with the two long scattering bars 501 may be performed by any appropriate photolithography apparatus.

Further, after aligning the reticle 5 with the two scattering bars 501 obtained by the OPC process, an exposure process may be performed; and a patterned photoresist layer (not shown) may be formed on the second dielectric layer. Referring to FIG. 7, the two long scattering bars 501 with the pre-determined position, length and width obtained by an OPC process may improve the light intensity distribution of the photoresist layer on the two conductive vias 40. Thus, the incomplete coverage issue of the two conductive vias 40 may be avoided. Further, the peeling issue of the line patterns of the patterned photoresist layer may also be avoided. Thus, the subsequently formed metal line patterns on the semiconductor substrate may not be shorted.

Further, after forming the patterned photoresist layer, trenches (not shown) may be formed in the second dielectric layer; and metal line patterns may be formed in the trenches by filling the trenches using a metal. The metal line patterns may completely cover the two conductive vias 40; and may electrically contact with the two conductive vias 40.

Further, after forming the metal line patterns, the patterned photoresist layer may be removed; and followed by removing a portion of the metal line patterns higher than the top surface of the second dielectric layer. The patterned photoresist layer may be removed by any appropriate process, such as a dry etching process, or a wet etching process. In one embodiment, the patterned photoresist layer is removed by a plasma ashing process.

The metal line patterns higher than the top surface of the second dielectric layer may be removed by any appropriate process, such as a CMP process, or a physical mechanical polishing process. In one embodiment, a CMP process is used to remove the metal line patterns higher than the top surface of the second dielectric layer.

By controlling the shape of the patterned photoresist layer formed by using the reticle 5 with the two long scattering patterns 501 obtained by the OPC process, the trenches formed in the second dielectric layer using the patterned photoresist layer may cover the entire surfaces of the two conductive vias 40. Further, the second dielectric layer between adjacent trenches may not have a significantly large shrinkage to cause the subsequently formed metal line patterns to be shorted. Thus, the interconnect performance of the metal interconnect structure may be improved.

Therefore, according to the disclosed processes and device structures, the reticle for forming the metal line patterns include a metal line corresponding region and at least one scattering bar. The metal pattern corresponding region and the scattering bar are obtained by an optical proximity correction process. The scattering bar may change the light intensity distribution in the photoresist layer at the conductive via during the photolithography process. Thus, the patterned photoresist layer after the photolithography process may shrink to a certain extent. The trenches in the second dielectric formed by the shrunk patterned photoresist layer may expose the entire top surface of the conductive via. Thus, the metal line patterns formed by filling a metal material in the trenches may completely cover the conductive via; and the interconnect properties of the metal interconnect structure may be improved. Further, the shrinking extent of the patterned photoresist may not cause a peeling issue of the photoresist. Thus, the metal line patterns formed in the trenches may not be shorted.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a metal interconnect structure, comprising:

forming a reticle having a metal line pattern region and at least a scattering bar by an optical proximity correction process, wherein the metal line pattern region includes a plurality of metal line patterns;

providing a first dielectric layer and at least one conductive via in the first dielectric layer, on a semiconductor substrate;

placing the reticle over the semiconductor substrate, used for a photo-exposure process, such that the scattering bar on the reticle is aligned next to the conductive via on the semiconductor substrate; and forming a plurality of metal lines, corresponding to the plurality of metal line patterns on the reticle, on the first dielectric layer and on a top surface of the conductive via to overlap with the conductive via on the semiconductor substrate.

2. The method according to claim 1, wherein:

the scattering bar is a long stripe; and on the reticle, the long stripe of the scattering bar has a length direction perpendicular to a direction of a connect line between a center of the scattering bar and a center of the metal line patterns.

3. The method according to claim 1, wherein:

the at least a scattering bar includes two or more scattering bars in parallel; and on the reticle, the scattering bars have a length direction in parrellel with the metal line patterns.

4. The method according to claim 1, further including:

two or more conductive vias, wherein:

the scattering bar is a continuous long stripe parallel to a connection line of centers of the two or more conductive vias.

5. The method according to claim 1, wherein:

a width of the scattering bar is in a range of approximately 15 nm~30 nm.

6. The method according to claim 1, wherein:

a distance between adjacent metal line patterns is in a range of approximately 30 nm~100 nm.

7. The method according to claim 1, wherein forming the plurality of metal lines on the semiconductor substrate includes using a photoresist layer, wherein:

the photoresist layer includes a positive photoresist;

the metal line pattern corresponding region is a transparent region; and the scattering bar is opaque.

8. The method according to claim 1, wherein forming the plurality of metal lines on the semiconductor substrate includes using a photoresist layer, wherein:

the photoresist layer includes negative photoresist;

the metal line pattern corresponding region is an opaque region; and the scattering bar is transparent.

9. The method according to claim 1, wherein the optical proximity correction process includes:

setting initial position, length and width of the scattering bar;

using the initial position, length and width to form the scattering bar on the reticle if the metal line corresponding region matches desired requirements after forming the metal lines on the semiconductor substrate;

adjusting the position, length and width of the scattering bars if the metal line corresponding region does not match the desired requirements; and repeating the adjustment until the metal line pattern corresponding region matches desired requirements.

10. The method according to claim 9, wherein the desired requirements further includes:

on the semiconductor substrate, the metal lines completely cover and electrically contact the conductive vias; and a patterned photoresist layer is used for forming the metal lines on the semiconductor substrate and does not have a peeling issue.

11. The method according to claim 10, further including:
obtaining the initial position, length and width of the scattering bar by experience; and
approaching the position, the length and the width of the scattering bars step-by-step within the available values until the requirements are matched.

12. The method according to claim 1, wherein forming the metal line patterns on the first dielectric layer and the top surface of the plurality of conductive vias further includes:
forming a second dielectric layer on the first dielectric layer and the conductive via;
forming a patterned photoresist layer on the second dielectric layer using the reticle formed by an optical proximity correction process;
forming trenches in the second dielectric layer;
removing the patterned photoresist layer;
filling the trenches with a metal material; and
performing a chemical mechanical polishing process on the metal material until a top surface of the second dielectric layer is exposed.

13. The method according to claim 12, wherein:
the patterned photoresist layer is removed by a plasma ashing process.

14. The method according to claim 1, wherein:
the first dielectric layer is made of silicon oxide.

15. The method according to claim 1, wherein:
a shape of the conductive vias is rectangular.

16. The method according to claim 1, wherein:
a light intensity distribution of the photoresist layer is changed at the conductive via, after the scattering bar on the reticle is aligned next to the conductive via on the semiconductor substrate.

17. The method according to claim 1, wherein:
when placing the reticle over the semiconductor substrate, the conductive via on the semiconductor substrate is aligned between the scattering bar on the reticle and the plurality of metal line patterns on the reticle, and
the conductive via on the semiconductor substrate overlaps with at least one of the plurality of metal line patterns on the reticle.

* * * * *